(12) United States Patent
Ingle et al.

(10) Patent No.: US 7,642,171 B2
(45) Date of Patent: Jan. 5, 2010

(54) MULTI-STEP ANNEAL OF THIN FILMS FOR FILM DENSIFICATION AND IMPROVED GAP-FILL

(75) Inventors: Nitin K. Ingle, Santa Clara, CA (US); Zheng Yuan, Fremont, CA (US); Vikash Banthia, Mountain View, CA (US); Xinyun Xia, Sunnyvale, CA (US); Hali J. L. Forstner, Belmont, CA (US); Rong Pan, San Jose, CA (US)

(73) Assignee: Applied Materials, Inc., Santa Clara, CA (US)

( * ) Notice: Subject to any disclaimer, the term of this patent is extended or adjusted under 35 U.S.C. 154(b) by 0 days.

(21) Appl. No.: 10/990,002

(22) Filed: Nov. 16, 2004

(65) Prior Publication Data

US 2006/0030165 A1 Feb. 9, 2006

Related U.S. Application Data

(60) Provisional application No. 60/598,939, filed on Aug. 4, 2004.

(51) Int. Cl.
*H01L 21/76* (2006.01)
(52) U.S. Cl. .................. 438/424; 438/425; 438/428; 438/437; 257/E21.545
(58) Field of Classification Search ......... 438/424–446; 257/E21.545
See application file for complete search history.

(56) References Cited

U.S. PATENT DOCUMENTS

| | | | |
|---|---|---|---|
| 2,861,009 A | 11/1958 | Rubner | |
| 2,889,704 A | 8/1959 | Pekarek | |
| 3,046,177 A | 7/1962 | Hankins | |
| 3,048,888 A | 8/1962 | Shockley et al. | |
| 3,109,703 A | 11/1963 | Politzer et al. | |
| 3,142,714 A | 7/1964 | Politzer et al. | |
| 3,166,454 A | 1/1965 | Voelker | |
| 4,297,162 A | 10/1981 | Mundt et al. | |
| 4,590,042 A | 5/1986 | Drage | |
| 4,732,761 A | 3/1988 | Machida et al. | |
| 4,792,378 A | 12/1988 | Rose et al. | |

(Continued)

FOREIGN PATENT DOCUMENTS

CA 479107 12/1951

(Continued)

OTHER PUBLICATIONS

Applied Materials Website Printout: "SACVD (Sub-Atmospheric Chemical Vapor Deposition)" from www.appliedmaterials.com/products/sacvd.html, printed Jun. 20, 2003.

(Continued)

*Primary Examiner*—H. Jey Tsai
(74) *Attorney, Agent, or Firm*—Townsend and Townsend and Crew LLP

(57) ABSTRACT

A method of annealing a substrate comprising a trench containing a dielectric material, the method including annealing the substrate at a first temperature of about 200° C. to about 800° C. in a first atmosphere comprising an oxygen containing gas, and annealing the substrate at a second temperature of about 800° C. to about 1400° C. in a second atmosphere lacking oxygen. In addition, a method of annealing a substrate comprising a trench containing a dielectric material, the method including annealing the substrate at a first temperature of about 400° C. to about 800° C. in the presence of an oxygen containing gas, purging the oxygen containing gas away from the substrate, and raising the substrate to a second temperature from about 900° C. to about 1100° C. to further anneal the substrate in an atmosphere that lacks oxygen.

26 Claims, 8 Drawing Sheets

U.S. PATENT DOCUMENTS

| | | | |
|---|---|---|---|
| 4,854,263 A | 8/1989 | Chang et al. |
| 4,892,753 A | 1/1990 | Wang et al. |
| 4,962,063 A | 10/1990 | Maydan et al. |
| 4,989,541 A | 2/1991 | Mikoshiba et al. |
| 5,051,380 A | 9/1991 | Maeda et al. |
| 5,089,442 A | 2/1992 | Olmer |
| 5,124,014 A | 6/1992 | Foo et al. |
| 5,204,288 A | 4/1993 | Marks et al. |
| 5,244,841 A | 9/1993 | Marks et al. |
| 5,264,040 A | 11/1993 | Geyling et al. |
| 5,314,845 A | 5/1994 | Lee et al. |
| 5,356,722 A | 10/1994 | Nguyen et al. |
| 5,439,524 A | 8/1995 | Cain et al. |
| 5,474,955 A | 12/1995 | Thakur |
| 5,492,858 A | 2/1996 | Bose et al. |
| 5,567,267 A | 10/1996 | Kazama et al. |
| 5,589,002 A | 12/1996 | Su |
| 5,597,439 A | 1/1997 | Salzman |
| 5,660,472 A | 8/1997 | Peuse et al. |
| 5,710,079 A | 1/1998 | Sukharev |
| 5,728,223 A | 3/1998 | Murakami et al. |
| 5,728,260 A | 3/1998 | Brown et al. |
| 5,789,322 A | 8/1998 | Brown et al. |
| 5,807,785 A | 9/1998 | Ravi |
| 5,812,403 A | 9/1998 | Fong et al. |
| 5,840,631 A | 11/1998 | Kubo et al. |
| 5,939,763 A | 8/1999 | Hao et al. |
| 5,965,203 A | 10/1999 | Gabric et al. |
| 5,976,261 A | 11/1999 | Moslehi et al. |
| 5,980,686 A | 11/1999 | Goto |
| 6,001,175 A | 12/1999 | Maruyama et al. |
| 6,013,584 A | 1/2000 | M'Saad |
| 6,024,799 A | 2/2000 | Chen et al. |
| 6,030,460 A | 2/2000 | Sukharev |
| 6,043,136 A | 3/2000 | Jang et al. |
| 6,050,506 A | 4/2000 | Guo et al. |
| 6,079,353 A | 6/2000 | Leksell et al. |
| 6,079,356 A | 6/2000 | Umotoy et al. |
| 6,099,647 A | 8/2000 | Yieh et al. |
| 6,106,663 A | 8/2000 | Kuthi et al. |
| 6,106,678 A | 8/2000 | Shufflebotham et al. |
| 6,133,160 A | 10/2000 | Komiyama et al. |
| 6,136,685 A | 10/2000 | Narwankar et al. |
| 6,140,242 A | 10/2000 | Oh et al. |
| 6,149,987 A | 11/2000 | Perng et al. |
| 6,150,209 A | 11/2000 | Sun et al. |
| 6,150,286 A | 11/2000 | Sun et al. |
| 6,156,114 A | 12/2000 | Bell et al. |
| 6,171,901 B1 | 1/2001 | Blair et al. |
| 6,184,155 B1 | 2/2001 | Yu et al. |
| 6,190,973 B1 | 2/2001 | Berg et al. |
| 6,194,038 B1 | 2/2001 | Rossman |
| 6,197,705 B1 | 3/2001 | Vassiliev |
| 6,203,863 B1 | 3/2001 | Liu et al. |
| 6,206,972 B1 | 3/2001 | Dunham |
| 6,217,658 B1 | 4/2001 | Orczyk et al. |
| 6,218,268 B1 | 4/2001 | Xia et al. |
| 6,232,580 B1 | 5/2001 | Sandhu |
| 6,236,105 B1 | 5/2001 | Kariya |
| 6,239,002 B1 | 5/2001 | Jang et al. |
| 6,239,044 B1 | 5/2001 | Kashiwagi et al. |
| 6,245,192 B1 | 6/2001 | Lenz et al. |
| 6,245,689 B1 | 6/2001 | Hao et al. |
| 6,248,397 B1 | 6/2001 | Ye |
| 6,248,628 B1 | 6/2001 | Halliyal et al. |
| 6,267,074 B1 | 7/2001 | Okumura |
| 6,276,072 B1 | 8/2001 | Morad et al. |
| 6,302,965 B1 | 10/2001 | Umotoy et al. |
| 6,319,849 B1 | 11/2001 | Oda et al. |
| 6,331,494 B1 | 12/2001 | Olson et al. |
| 6,337,256 B1 | 1/2002 | Shim |
| 6,340,435 B1 | 1/2002 | Bjorkman et al. |
| 6,348,421 B1 | 2/2002 | Shu et al. |
| 6,436,193 B1 | 8/2002 | Kasai et al. |
| 6,444,039 B1 | 9/2002 | Nguyen et al. |
| 6,454,860 B2 | 9/2002 | Metzner et al. |
| 6,468,853 B1 | 10/2002 | Balasubramanian et al. |
| 6,475,284 B1 | 11/2002 | Moore et al. |
| 6,479,405 B2 | 11/2002 | Lee et al. |
| 6,489,254 B1 | 12/2002 | Kelkar et al. |
| 6,500,771 B1 | 12/2002 | Vassiliev et al. |
| 6,512,264 B1 | 1/2003 | Ogle, Jr. et al. |
| 6,527,910 B2 | 3/2003 | Rossman |
| 6,541,367 B1 | 4/2003 | Mandal |
| 6,541,401 B1 | 4/2003 | Herner et al. |
| 6,565,661 B1 | 5/2003 | Nguyen et al. |
| 6,583,069 B1 | 6/2003 | Vassiliev et al. |
| 6,586,886 B1 | 7/2003 | Katz et al. |
| 6,602,792 B2 * | 8/2003 | Hsu .......................... 438/704 |
| 6,617,259 B2 | 9/2003 | Jung et al. |
| 6,624,091 B2 | 9/2003 | Yuan |
| 6,677,712 B2 | 1/2004 | Katz et al. |
| 6,713,127 B2 | 3/2004 | Subramony et al. |
| 6,733,955 B1 | 5/2004 | Geiger et al. |
| 6,734,115 B2 | 5/2004 | Cheung et al. |
| 6,740,601 B2 | 5/2004 | Tan et al. |
| 6,793,733 B2 | 9/2004 | Janakiraman et al. |
| 6,830,624 B2 | 12/2004 | Janakiraman et al. |
| 6,875,558 B1 | 4/2005 | Gaillard et al. |
| 6,905,940 B2 | 6/2005 | Ingle et al. |
| 6,943,091 B2 | 9/2005 | Yu et al. |
| 6,946,358 B2 * | 9/2005 | Doris et al. ................. 438/424 |
| 6,949,447 B2 * | 9/2005 | Ahn et al. .................. 438/436 |
| 7,037,859 B2 | 5/2006 | Ingle et al. |
| 7,141,483 B2 | 11/2006 | Yuan et al. |
| 7,208,425 B2 | 4/2007 | Ingle et al. |
| 7,335,609 B2 | 2/2008 | Ingle et al. |
| 2001/0019860 A1 | 9/2001 | Adachi et al. |
| 2002/0000195 A1 | 1/2002 | Bang et al. |
| 2002/0000196 A1 | 1/2002 | Park |
| 2002/0004282 A1 * | 1/2002 | Hong ......................... 438/424 |
| 2002/0006729 A1 | 1/2002 | Geiger et al. |
| 2002/0007790 A1 | 1/2002 | Park |
| 2002/0011215 A1 | 1/2002 | Tel et al. |
| 2002/0050605 A1 | 5/2002 | Jenq |
| 2002/0052128 A1 | 5/2002 | Yu et al. |
| 2002/0102358 A1 | 8/2002 | Das et al. |
| 2002/0163028 A1 | 11/2002 | Zheng |
| 2002/0168840 A1 | 11/2002 | Hong et al. |
| 2002/0192370 A1 | 12/2002 | Metzner et al. |
| 2003/0019428 A1 | 1/2003 | Ku et al. |
| 2003/0022523 A1 * | 1/2003 | Irino et al. .................. 438/769 |
| 2003/0054670 A1 | 3/2003 | Wang et al. |
| 2003/0057432 A1 | 3/2003 | Gardner et al. |
| 2003/0071304 A1 | 4/2003 | Ogle, Jr. et al. |
| 2003/0073290 A1 | 4/2003 | Ramkumar et al. |
| 2003/0089314 A1 | 5/2003 | Matsuki et al. |
| 2003/0104677 A1 * | 6/2003 | Park et al. .................. 438/424 |
| 2003/0107079 A1 | 6/2003 | Iwata et al. |
| 2003/0111961 A1 | 6/2003 | Katz et al. |
| 2003/0138562 A1 | 7/2003 | Subramony et al. |
| 2003/0140851 A1 | 7/2003 | Janakiraman et al. |
| 2003/0168006 A1 | 9/2003 | Williams |
| 2003/0201723 A1 | 10/2003 | Katz et al. |
| 2003/0203515 A1 | 10/2003 | Lin et al. |
| 2003/0207530 A1 | 11/2003 | Yu et al. |
| 2003/0209323 A1 | 11/2003 | Yokogaki |
| 2004/0003873 A1 | 1/2004 | Chen et al. |
| 2004/0018699 A1 | 1/2004 | Boyd et al. |
| 2004/0060514 A1 | 4/2004 | Janakiraman et al. |
| 2004/0083964 A1 | 5/2004 | Ingle et al. |
| 2004/0161903 A1 | 8/2004 | Yuan et al. |
| 2004/0200499 A1 | 10/2004 | Harvey et al. |
| 2004/0216844 A1 | 11/2004 | Janakiraman et al. |

| | | | |
|---|---|---|---|
| 2004/0224537 | A1* | 11/2004 | Lee et al. .................... 438/782 |
| 2005/0064730 | A1 | 3/2005 | Ingle et al. |
| 2005/0186755 | A1 | 8/2005 | Smythe et al. |
| 2005/0271812 | A1 | 12/2005 | Myo et al. |
| 2006/0030165 | A1 | 2/2006 | Ingle et al. |
| 2006/0046427 | A1 | 3/2006 | Ingle et al. |
| 2006/0148273 | A1 | 7/2006 | Ingle et al. |

FOREIGN PATENT DOCUMENTS

| | | |
|---|---|---|
| EP | 0520519 A1 | 12/1992 |
| EP | 0959496 A2 | 11/1999 |
| JP | 01283375 A | 11/1989 |
| JP | 01294868 A | 11/1989 |
| JP | 4154116 A | 5/1992 |
| JP | 11176593 A | 7/1999 |
| TW | 479305 | 3/2002 |
| TW | 479315 | 3/2002 |
| WO | WO 9925895 A1 | 5/1999 |
| WO | WO 00/77831 A2 | 12/2000 |
| WO | WO 2005/071740 A | 8/2005 |
| WO | WO 2005/117087 A | 12/2005 |

OTHER PUBLICATIONS

Baker, F. et al. "STI TEOS Densification for Furnaces and RTP Tools" 1999 IEEE/SEMI Advanced Semiconductor Manufacturing Conference, 1999, pp. 394-399.

Definitions of "furnace", Merriam-Webster Online, 2006.

Fujino, K. et al., "Dependence Of Deposition Characteristics On Base Materials in TEOS And Ozone CVD At Atmospheric Pressure," J. Electrochem. Soc., vol. 138, No. 2, pp. 550-554, Feb. 1991.

Kuo, Yue, "Etch Mechanism In The Low Refractive Index Silicon Nitride Plasma-Enhanced Chemical Vapor Deposition Process," Appl. Phys. Lett., vol. 63, No. 2, pp. 144-146, Jul. 12, 1993.

Kwok, K. et al., "Surface Related Phenomena In Integrated PECVD/Ozone-TEOS SACVD Processes For Sub-Half Micron Gap Fill: Electrostatic Effects," J. Electrochem. Soc., vol. 141, No. 8, pp. 2172-2177, Aug. 1994.

Lassig, Stephan E. et al., "Intermetal Dielectric Deposition By Electron Cyclotron Resonance Chemical Vapor Deposition (ECR CVD)," pp. cover and 1-21, no date.

Li, Junling et al., "Modeling Studies Of The Mechanisms In Biased ECR CVD," 3 pages, no date.

Machida, Katsuyuki et al., "SiO2 Planarization Technology With Biasing And Electron Cyclotron Resonance Plasma Deposition For Submicron Interconnections," J Vac. Sci. Technol. B, vol. 4, No. 4, pp.818-821, Jul./Aug. 1986.

Romanelli, Alex, Semiconductor International website article: AMD Details 45nm Technology, at www.e-insite.net/semiconductor/; Jun. 12, 2003.

* cited by examiner

MULTI-STEP ANNEAL OF THIN FILMS FOR FILM DENSIFICATION AND IMPROVED GAP-FILL

CROSS-REFERENCES TO RELATED APPLICATIONS

This application claims the benefit of U.S. Provisional Application No. 60/598,939, filed Aug. 4, 2004, entitled "MULTI-STEP ANNEAL OF THIN FILMS FOR FILM DENSIFICATION AND IMPROVED GAP-FILL," the entire contents of which are herein incorporated by this reference.

BACKGROUND OF THE INVENTION

As semiconductor device densities continue to get larger and isolation structures between devices continue to get smaller, the challenge of isolating individual devices from one another gets ever more difficult. Improper device isolation is the root cause of a number of device defects, including current leakages that waste power, latch-up that can cause intermittent (and sometimes permanent) damage to circuit functioning, noise margin degradation, voltage shift, and signal crosstalk, to name just some of the problems.

Prior device isolation techniques included local oxidization on silicon (LOCOS) processes that laterally isolated the active device regions on the semiconductor device. LOCOS processes, however, have some well known shortcomings: Lateral oxidization of silicon underneath a silicon nitride mask make the edge of field oxide resemble the shape of a "bird's beak." In addition, lateral diffusion of channel-stop dopants make the dopants encroach into the active device regions, thereby overshrinking the width of the channel region. These and other problems with LOCOS processes were exacerbated as device size continued to shrink with very large scale integration (VLSI) implementation, and new isolation techniques were needed.

Current isolation techniques include shallow trench isolation (STI) processes. Early STI processes typically included etching a trench having a predetermined width and depth into a silicon substrate, filling the trench with a layer of dielectric material (e.g., silicon dioxide), and finally planarizing the dielectric materials by, for example, chemical-mechanical polishing (CMP). For a time, the early STI processes were effective for isolating devices spaced closer together (e.g., 150 nm or more), but as the inter-device space continued to shrink, problems developed.

One of these problems is avoiding the formation of voids and weak seams during the deposition of dielectric material in the trenches. As trench widths continue to shrink, the aspect ratio of trench height to trench width gets higher, and high-aspect ratio trenches (e.g., aspect ratios of about 6:1 or more) are more prone to form voids in the dielectric material due to the premature closure of the trench (e.g., the "bread-loafing" of the dielectric material around the top corners of the trench). The weak seams and voids create uneven regions of dielectric characteristics in trench isolations, which adversely impact the electrical characteristics of the adjacent devices and can even result in device failure.

One technique for avoiding voids is to reduce the deposition rate to a point were the dielectric material evenly fills the trench from the bottom up. While this technique has shown some effectiveness, it slows the overall production time and thereby reduces production efficiency. Thus, there remains a need for device isolation techniques that include the efficient filling of inter-device trenches that also reduce and/or eliminate voids created in the filled trenches.

BRIEF SUMMARY OF THE INVENTION

Embodiments of the present invention include a method of annealing a substrate. The substrate may include a trench containing a dielectric material. The method may include the steps of annealing the substrate at a first temperature of about 200° C. to about 800° C. in an oxidizing environment, or ambient. The method may also include annealing the substrate at a second temperature of about 800° C. to about 1400° C. in a second atmosphere lacking oxygen.

Embodiments of the present invention also include a method of annealing a substrate that includes a trench containing a dielectric material. The method includes the step of annealing the substrate at a first temperature of about 400° C. to about 800° C. in the presence of an oxygen containing gas. The method also includes purging the oxygen containing gas away from the substrate, and raising the substrate to a second temperature from about 900° C. to about 1100° C. to further anneal the substrate in an atmosphere that lacks oxygen.

Embodiments of the present invention further include an annealing system. The annealing system includes a housing configured to form an annealing chamber, and a substrate holder configured to hold a substrate within said annealing chamber, where the substrate comprises a trench filled with a dielectric material. The annealing system may further include a gas distribution system configured to introduce gases into said annealing chamber; and a heating system configured to heat the substrate. The gas distribution system introduces a first anneal gas comprising an oxygen containing gas into the chamber while the heating system heats the substrate to a first temperature of about 200° C. to about 800° C. In addition, the heating system heats the substrate to a second temperature of about 800° C. to about 1400° C. in an atmosphere lacking oxygen, after a purge of the oxygen containing gas from the chamber.

Additional features are set forth in part in the description that follows, and in part will become apparent to those skilled in the art upon examination of the following specification or may be learned by the practice of the invention. The features and advantages of the invention may be realized and attained by means of the instrumentalities, combinations, and methods particularly pointed out in the appended claims.

DETAILED DESCRIPTION OF THE INVENTION

Figure 1:
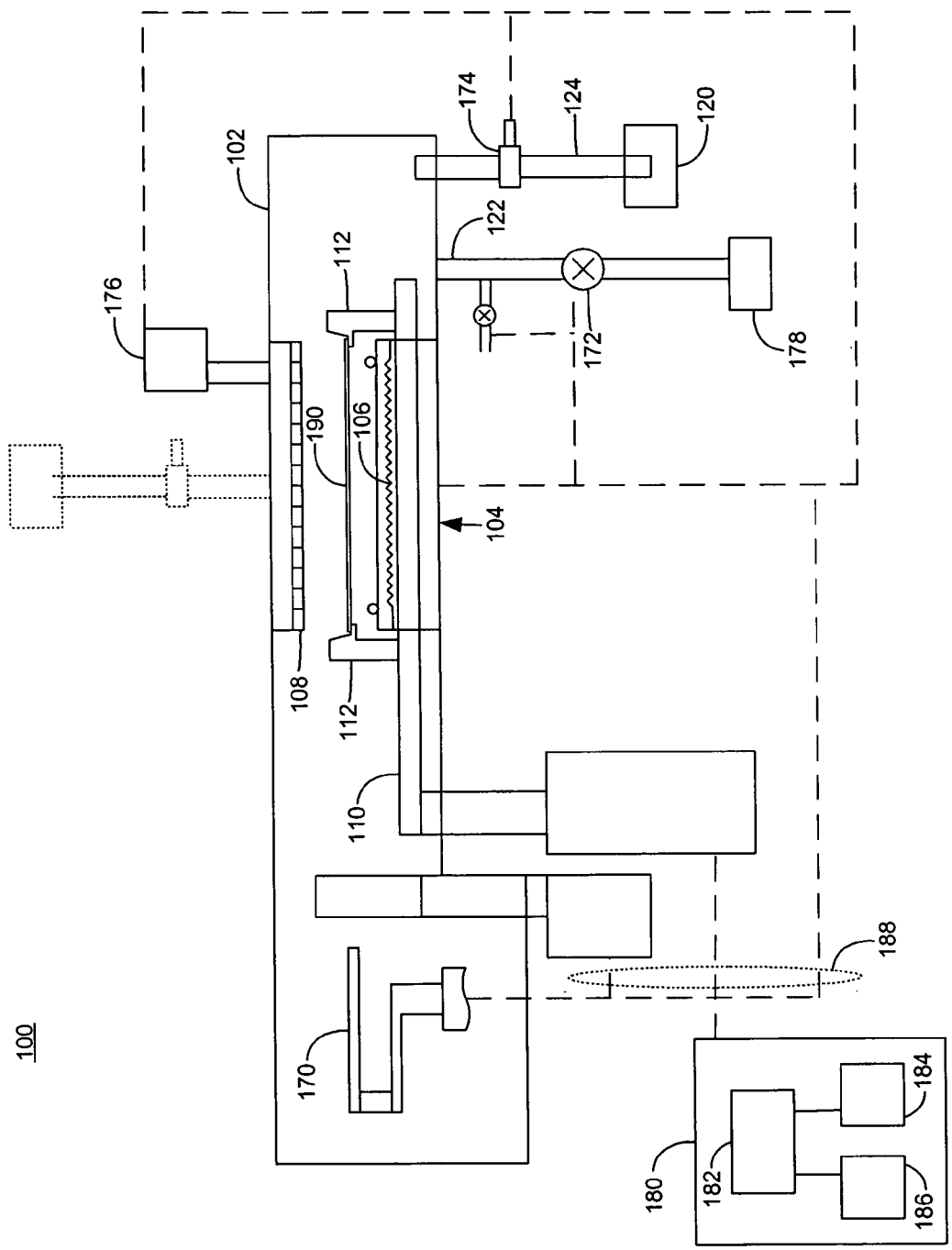
FIG. 1 shows an example of a furnace anneal chamber that may be used with embodiments of the methods of the present invention.

As noted above, the development of voids and weak seams in trench isolations has become an increasing problem as trench widths get smaller (e.g., about 90 nm or less) and trench aspect ratios get higher (e.g., about 6:1 or higher). Embodiments of the present invention include methods of annealing these filled trenches at a lower temperature (e.g., about 200° C. to about 800° C.) in an atmosphere that includes an oxygen containing gas, followed by annealing the trenches at a higher temperature (e.g., about 800° C. to about 1400° C.) in an atmosphere that lacks oxygen.

Annealing the trenches at the lower temperature in an environment that includes one or more oxygen containing species (e.g., $H_2O$, $NO$, $N_2O$, $O_2$, etc.) rearranges and strengthens the silicon oxide network to prevent the formation of voids and opening of weak seams in the trenches. This is sometimes referred to as oxide "healing" of the seams and voids in the dielectric material. The lower temperature of the anneal keeps the oxygen from reacting with the trench walls and other portions of the silicon substrate to form undesirable oxide films.

The annealing may continue (i.e., a second step of the anneal may commence) by heating the trench isolations at the higher temperature to rearrange the structure of the dielectric material and drive out moisture, both of which increase the density of the material. This higher temperature annealing is done in an environment that lacks oxygen. The environment may be, for example, substantially pure nitrogen ($N_2$), a mixture of nitrogen and noble gases (e.g., He, Ne, Ar, Xe) or a substantially pure noble gas, among other types of environments that lack an oxidizing gas. The environment may also include reducing gases such as hydrogen ($H_2$) or ammonia ($NH_3$). Annealing the trenches at the higher temperature in this environment facilitates the high-temperature densification without the oxidation of the silicon substrate.

Densification of the dielectric materials in the trenches may provide a number of advantages over the originally formed undensified material, including giving the materials a slower wet etch rate. Undensified materials deposited in the trenches by, for example, spin-on techniques can have wet etch rates about 10 to about 20 times faster or more than thermally grown oxide (e.g., a wet etch rate ratio (WERR) of about 10:1 or more). Likewise, undensified materials deposited by chemical vapor deposition typically have wet etch rates of about 5:1 or more. The high wet etch rates of the undensified dielectric material can result in the overetching of this material during subsequent planarization and/or oxide etching processes. The overetching may result in the formation of bowls or gaps at the tops of the trench isolations.

Embodiments of the present invention include methods of annealing dielectric filled trenches that combines the advantages of a lower temperature anneal in an oxygen containing environment with a higher temperature anneal in a substantially oxygen free environment. These methods may be conducted in annealing systems like the exemplary annealing systems described below.

Exemplary Annealing Systems

FIG. 1 shows a schematic representation of an apparatus 100 that is suitable for practicing embodiments of the present invention. The apparatus 100 comprises a process chamber 102 and a controller 180 connected to various hardware components (e.g., wafer handling robot 170, isolation valve 172 and mass flow controller 174, among others.) A detailed description of the chamber 102 has been disclosed in commonly-assigned U.S. patent application, entitled "Method and Apparatus for Heating and Cooling Substrates", Ser. No. 09/396,007, filed on Sep. 15, 1999, and is incorporated herein by reference. A brief description of the apparatus 100 is given below.

The apparatus 100 allows for rapid heating and cooling of a substrate within a single chamber 102, which comprises a heating mechanism, a cooling mechanism and a transfer mechanism to transfer a substrate 190 between the heating and the cooling mechanisms. As shown in the embodiment of FIG. 1, the heating mechanism comprises a heated substrate support 104 having a resistive heating element 106, and the cooling mechanism comprises a cooling fluid source 176 connected to a cooling plate 108 disposed at a distance apart from the heated substrate support 104. The transfer mechanism is, for example, a wafer lift hoop 110 having a plurality of fingers 112, which is used to transfer a substrate from a position proximate the heated substrate support 104 to a position proximate the cooling plate 108. A vacuum pump 178 and an isolation valve 172 are connected to an outlet 122 of the chamber 102 for evacuation and control of gas flow out of the chamber 102.

To perform annealing, the substrate 190 is placed on the heated substrate support 104, which is preheated to a temperature between about 100° C. and about 500° C. A gas source 120 allows annealing gases to enter the chamber 102 via the gas inlet 124 and the mass flow controller 174. Gas inlet 124 may also include an ignition source, such as a spark gap (not shown) to start the combustion of oxygen ($O_2$) and hydrogen ($H_2$) for in-situ generation of steam (ISSG).

After annealing, the substrate 190 is optionally cooled to a desirable temperature, e.g., below about 100° C., or below about 80° C., or below about 50° C., within the chamber 102. This can be accomplished, for example, by bringing the substrate 190 in close proximity to the cooling plate 108 using the wafer lift hoop 110. For example, the cooling plate 108 may be maintained at a temperature of about 5 to about 25° C. by a cooling fluid supplied from the cooling fluid source 176.

As illustrated in FIG. 1, the chamber 102 is also coupled to a controller 180, which controls the chamber 102 for implementing the annealing method of the present invention. Illustratively, the controller 180 comprises a general purpose computer or a central processing unit (CPU) 182, support circuitry 184, and memories 186 containing associated control software. The controller 180 is responsible for automated control of the numerous steps required for wafer processing such as wafer transport, gas flow control, temperature control, chamber evacuation, etc. Bi-directional communications between the controller 180 and the various components of the apparatus 100 are handled through numerous signal cables collectively referred to as signal buses 188, some of which are illustrated in FIG. 1.

Figure 2:
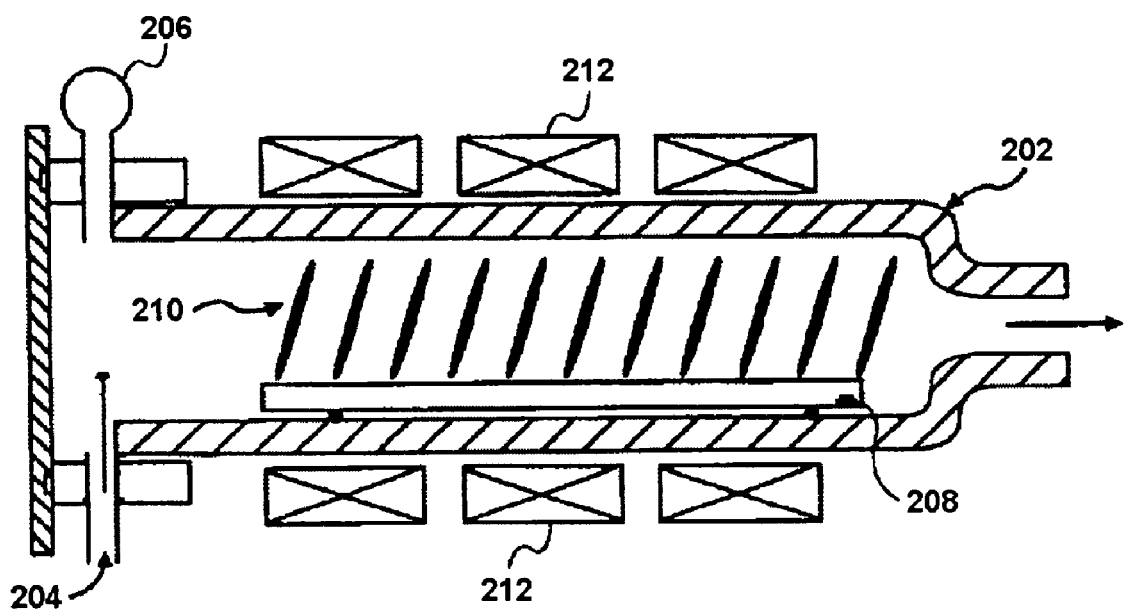
FIG. 2 shows another example of a furnace anneal chamber that may be used with embodiments of the methods of the present invention.

Referring now to FIG. 2, an apparatus 200 for annealing one or more substrates 210 according to embodiments of the methods of the present invention is shown. Apparatus 200 is a hot wall furnace system that includes a three-zone resistance furnace 212, a quartz reactor tube 202, a gas inlet 204, a pressure sensor 206, and a wafer boat 208. The one or more substrates 210 may be vertically positioned upon the wafer boat 208 for annealing. The wafers are radiantly heated by resistive heating coils surrounding the tube 202. Annealing gases are metered into one end of the tube 202 (gas inlet 204) using a mass flow controller, and may be pumped out the other end of the tube 202 (e.g., via an exhaust pump).

Figure 3:
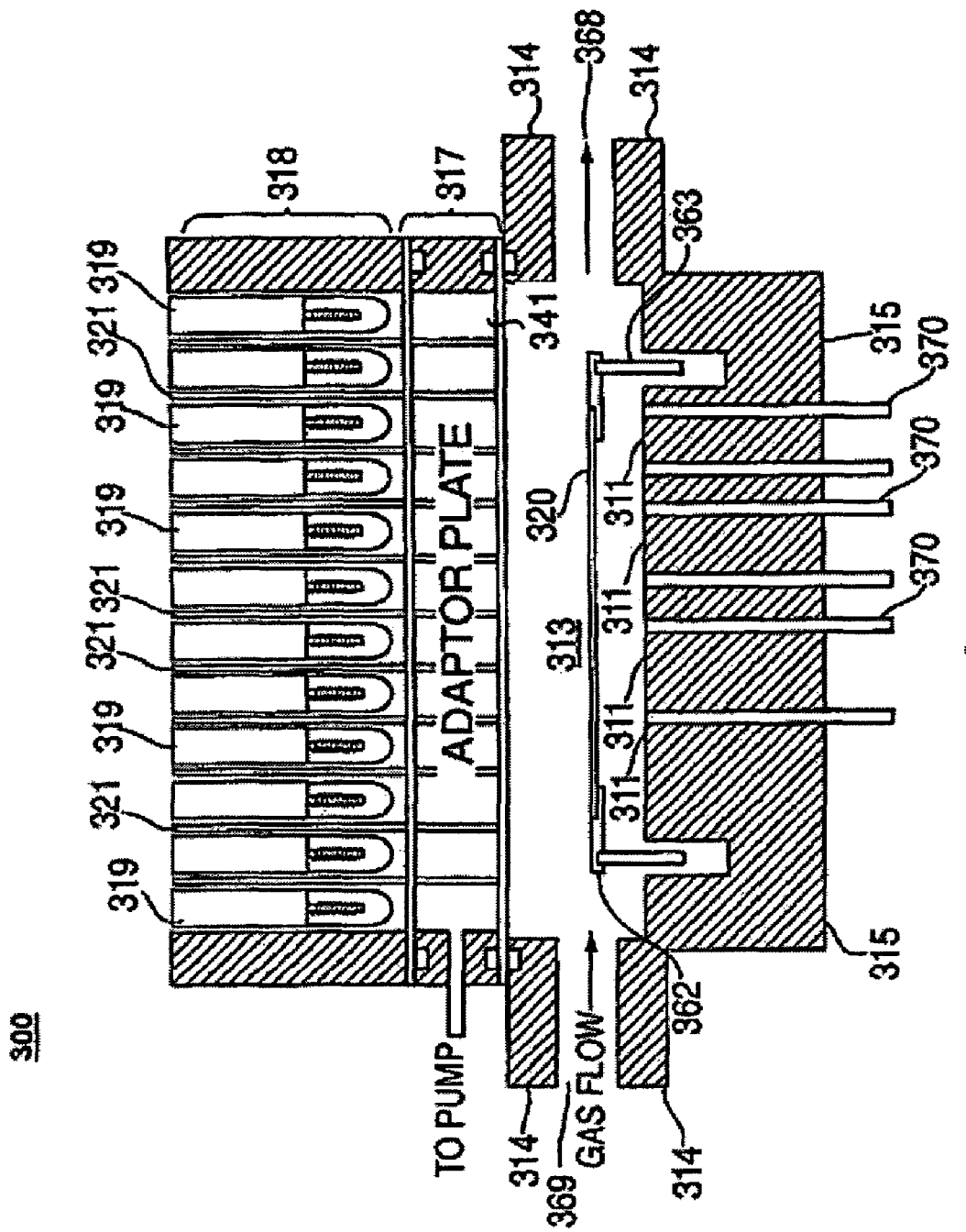
FIG. 3 shows an example of a rapid thermal processing (RTP) system that may be used with embodiments of the methods of the present invention.

Referring now to FIG. 3, a cross-sectional view of a rapid thermal processor (RTP) annealing chamber 300 that may be used with embodiments of the present invention is shown. An example of a RTP annealing chamber 300 is a RADIANCE® chamber that is commercially available from Applied Materials, Inc., Santa Clara, Calif. The RTP chamber 300 includes sidewalls 314, a bottom 315, and a window assembly 317. The sidewalls 314 and the bottom 315 generally comprise a metal such as, for example, stainless steel. The upper portions of sidewalls 314 are sealed to window assembly 317 by o-rings 316. A radiant energy assembly 318 is positioned over and coupled to window assembly 317. The radiant energy assembly 318 includes a plurality of lamps 319 each mounted to a light pipe 321.

The RTP annealing chamber 300 houses a substrate 320 supported around its perimeter by a support ring 362 made of, for example, silicon carbide. The support ring 362 is mounted on a rotatable cylinder 363. The rotatable cylinder causes the support ring 362 and the substrate to rotate within the RTP chamber 300.

The bottom 315 of RTP annealing chamber 300 includes a gold-coated top surface 311, which reflects light energy onto the backside of the substrate 320. Additionally, the RTP annealing chamber 300 includes a plurality of temperature probes 370 positioned through the bottom 315 of RTP annealing chamber 300 to detect the temperature of the substrate 320.

A gas inlet 369 through sidewall 314 provides annealing gases to the RTP annealing chamber 300. A gas outlet 368 positioned through sidewall 314 opposite to gas inlet 369 removes annealing gases from the RTP annealing chamber 300. The gas outlet 368 is coupled to a pump system (not shown) such as a vacuum source. The pump system exhausts annealing gases from the RTP annealing chamber 300 and maintains a desired pressure therein during processing.

The radiant energy assembly 318 preferably is configured so the lamps 319 are positioned in a hexagonal array or in a "honeycomb" arrangement, above the surface area of the substrate 320 and the support ring 362. The lamps 319 are grouped in zones that may be independently controlled, to uniformly heat the substrate 320.

The window assembly 317 includes a plurality of short light pipes 341 that are aligned to the light pipes 321 of the radiant energy assembly 318. Radiant energy from the lamps 321 is provided via light pipes 321, 341 to the annealing region 313 of RTP annealing chamber 300.

The RTP annealing chamber 300 may be controlled by a microprocessor controller (not shown). The microprocessor controller may be one of any form of general purpose computer processor (CPU) that can be used in an industrial setting for controlling process chambers as well as sub-processors. The computer may use any suitable memory, such as random access memory, read only memory, floppy disk drive, hard drive, or any other form of digital storage, local or remote. Various support circuits may be coupled to the CPU for supporting the processor in a conventional manner. Software routines as required may be stored in the memory or executed by a second CPU that is remotely located.

The process sequence routines are executed after the substrate is positioned on the pedestal. The software routines, when executed, transform the general purpose computer into a specific process computer that controls the chamber operation so that chamber annealing is performed. Alternatively, the software routines may be performed in hardware, as an application specific integrated circuit or other type of hardware implementation, or a combination of software and hardware.

Exemplary Semiconductor Devices

Figure 4:
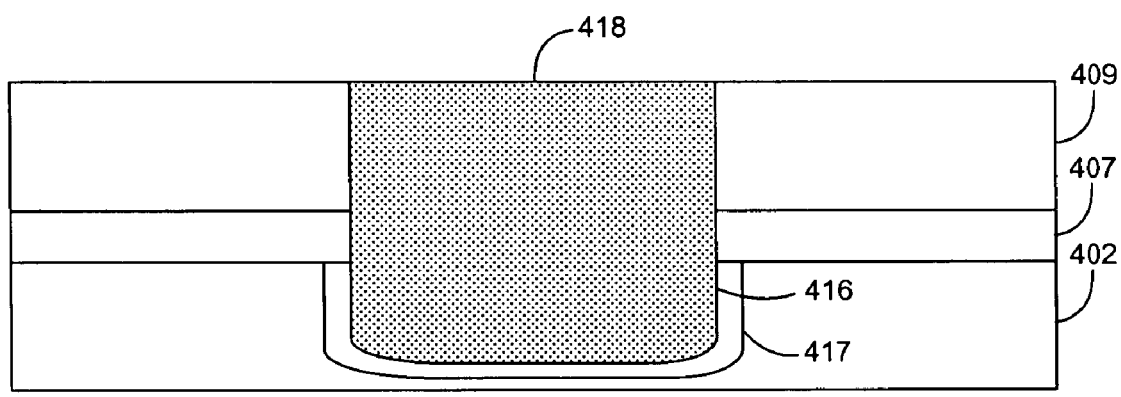
FIG. 4 shows an example of a dielectric filled trench formed in a substrate that may be annealed according to embodiments of the method of the present invention.

Referring now to FIG. 4, an example of a dielectric filled trench formed in a substrate that may be annealed according to embodiments of the invention is shown. The trench isolation structure 400 includes a nitride layer 409 formed on pad-oxide layer 407, which is formed on substrate 402 (e.g., a silicon substrate).

A nitride gap (not shown) is formed in nitride layer 409 by depositing and patterning a photoresist layer (not shown) on the nitride layer 409 such that a portion of the nitride layer 409 overlying the gap is exposed. A nitride etch is then performed to remove the exposed portion of the nitride layer 409. After the nitride gap is formed in the nitride layer 409, an oxide layer gap (not shown) may be formed in the pad-oxide layer 407. In this step, nitride layer 409 may act as a mask layer during an oxide etch of the underlying oxide layer 407 that is exposed by the nitride gap. The oxide etch removes the exposed portion of oxide layer 407, forming the oxide gap.

Following the formation of the oxide gap, the shallow rest of the shallow trench may be formed in the substrate layer 402. This may start with a substrate etch (e.g., a silicon etch) of substrate layer 402, with nitride layer 409 and pad-oxide layer 407 acting as etch mask layers. Following the substrate etch, trench 416 that is formed may be cleaned with cleaning agents (e.g., HF). In addition, a trench sidewall liner 417 may be formed in trench 416 by performing, for example, undergo a rapid thermal oxidation (RTO) (e.g., 1000° C.) in an oxide/oxinitride atmosphere, which may also round sharp corners on the trench 416 (and elsewhere).

After trench 416 is formed dielectric material 418 may be deposited to form the trench isolation structure 400. The trench 416 may be filled with dielectric material 418 according to chemical vapor deposition (CVD) techniques (e.g., low pressure CVD, plasma CVD, etc.), or spin-on dielectric techniques, among other deposition techniques.

For example, the dielectric material may be deposited by a High Aspect Ratio Process (HARP). In one embodiment the HARP includes using an $O_3$/tetraethoxy silane (TEOS) based sub-atmospheric chemical vapor deposition (SACVD) trench fill process like the ones described in commonly assigned U.S. patent application Ser. No. 10/247,672, filed on Sep. 19, 2002, entitled "METHOD USING TEOS RAMP-UP DURING TEOS/OZONE CVD FOR IMPROVED GAP FILL," and/or U.S. patent application Ser. No. 10/757,770, filed on Jan. 14, 2004, entitled "NITROUS OXIDE ANNEAL OF TEOS/OZONE CVD FOR IMPROVED GAPFILL," and/or U.S. patent application Ser. No. 10/057,280, filed on Jan. 25, 2002, entitled "GAS DISTRIBUTION SHOWERHEAD," and/or U.S. patent application Ser. No. 10/674,569, filed on Sep. 29, 2003, entitled "GAS DISTRIBUTION SHOWERHEAD," the entire contents of each of which are herein incorporated by reference.

The HARP process may include varying the ratio of Si (e.g., TEOS) to $O_3$, and the spacing between the substrate wafer and gas distribution plate (e.g., showerhead) over the course of the deposition of the gap materials. In the initial stages of a HARP deposition, the deposition rate may be lower by having a reduced concentration of Si relative to $O_3$ (e.g., a lower TEOS to $O_3$ ratio) and more spacing between the wafer a gas distribution plate (e.g., about 300 mils). The low deposition rate allows a more even trench fill with a reduced chance of forming voids due to, for example, bread-loafing of the fill material around the top corners of the trench.

In later stages of the HARP deposition after the trench is substantially filled, the deposition rate may be increased by increasing the concentration of Si relative to $O_3$ (e.g. a higher TEOS to $O_3$ ratio) and reducing the space between the wafer and gas distribution plate (e.g., spacing of about 100 mils), among other adjustments. This allows the more rapid deposition of the materials, which increases overall production efficiency by decreasing the deposition time. Thus, HARP depositions may include both a slower deposition rate stage when the slower rate is advantageous for reducing defects, and a higher deposition rate stage when the high rate results in shorter deposition times.

HARP depositions may be advantageous for gapfill depositions of trenches with high aspect ratios. The trench aspect ratio is the ratio of trench height (i.e., depth) to trench width, and trenches with high aspect ratios (e.g., about 6:1 or more) are more prone to develop voids during a gap fill process.

In some embodiments of the deposition of dielectric material 418, the pressure is maintained at sub-atmospheric pressures. In a specific embodiment, the pressure during the deposition process may range from about 200 torr to less than about 760 torr, although the pressure profile may remain within a much narrower range. In some embodiments the temperature is varied from about 400° C. to about 570° C., although the temperature may be maintained within a narrower range. Regulating the temperature and pressure of the chamber regulates a reaction between the silicon-containing process gas and the oxidizer-containing process gas. The WERR of the deposited material 418 may be about 6 or less prior to annealing.

Exemplary Annealing Method

Figure 5:
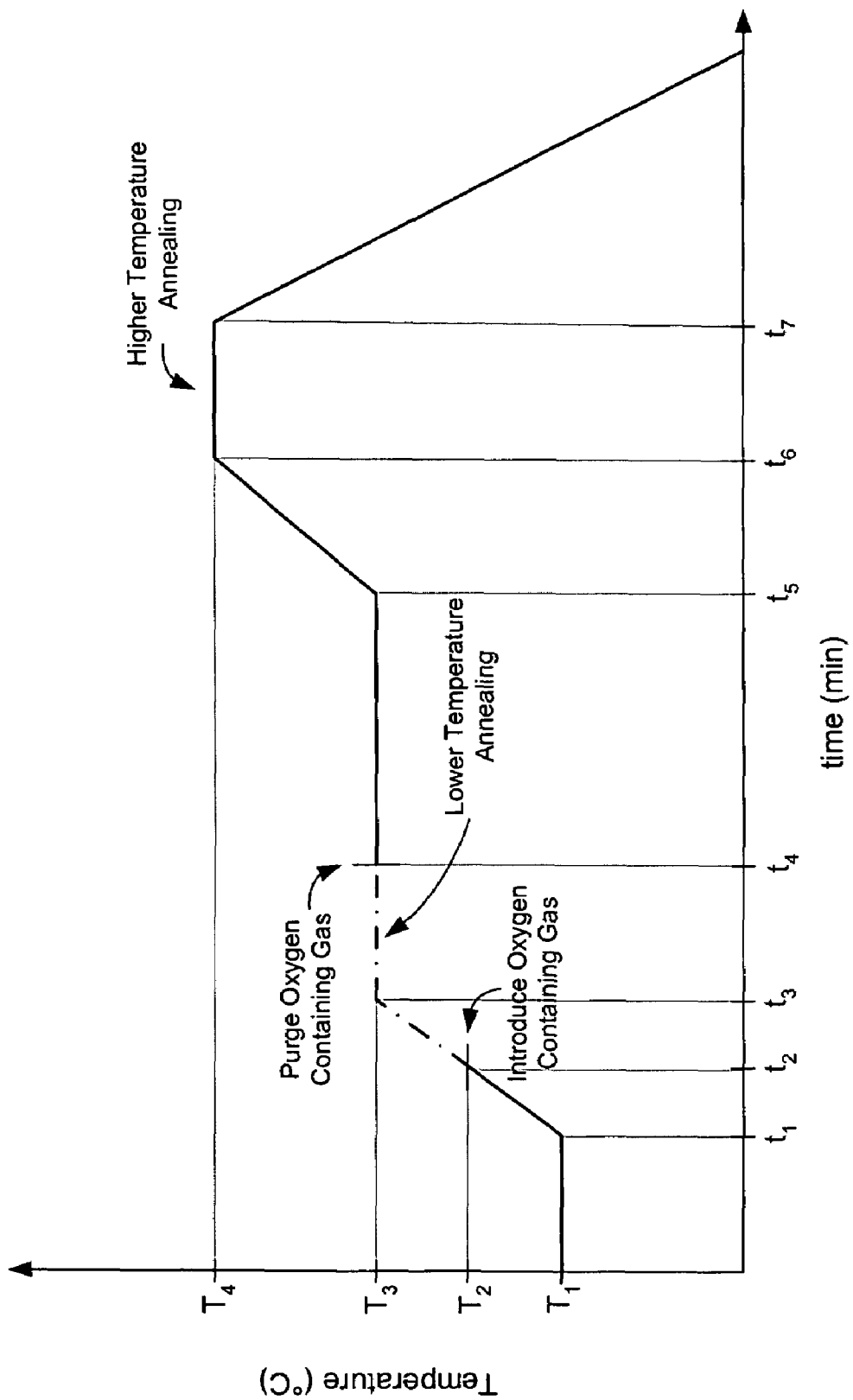
FIG. 5 plots substrate temperature over a period of time according to embodiments of the method of the present invention.

FIG. 5 plots the substrate temperature over a period of time according to an example of one of the annealing methods of the present invention. The plot starts with the substrate at temperature $T_1$ (e.g., about 400° C.) for a time $t_1$ (e.g., about 5 minutes to about 30 minutes). This portion of the plot may represent the substrate sitting in an annealing chamber and coming to an initial equilibrium temperature $T_1$.

After time $t_1$, the substrate temperature my be raised to the first anneal temperature $T_3$ (e.g., about 800° C.) at time $t_3$. The time $t_3$ depends on the rate of the temperature ramp up from $T_1$ to $T_3$ (e.g., about 4° C./min to about 15° C./min or more).

During the ramp up to temperature $T_3$, an oxygen containing gas (e.g., in-situ generated steam) may be introduced to the substrate. In this example, the oxygen containing gas is introduced at time $t_2$ (e.g., about 15 min after $t_1$) when the substrate temperature is $T_2$ (e.g., about 600° C.). In other examples, the oxygen containing gas may be introduced at when the substrate temperature reaches $T_3$ (i.e., $T_2=T_3$ and $t_2=t_3$).

The substrate, which includes trenches filled with dielectric materials, is then annealed at temperature $T_3$ until time $t_4$ (e.g., about 30 minutes after $t_3$). During this time any seams or voids formed during the deposition of the dielectric material in the trenches are being healed (i.e., filled with oxide materials). However, because the annealing is done at lower temperature, the reaction of oxygen with the silicon substrate and other non-oxide layers is reduced.

At time $t_4$, the oxygen containing gas is removed from contact with the substrate until time $t_5$ (e.g., about 60 minutes after $t_4$). The removal may be done by purging the annealing chamber holding the substrate with a dry purge gas (e.g., dry nitrogen ($N_2$)).

At the end of the purge period at time $t_5$, the temperature of the substrate may be ramped up again to temperature $T_4$ (e.g., about 1050° C.) at time $t_6$ (e.g., about 30 minutes after $t_5$) when the higher temperature annealing is performed. The higher temperature annealing is done in an atmosphere substantially free of oxygen (e.g., atomic, molecular, or ionic species of oxygen) from the oxygen containing gas or any other gases used during the anneal. This higher temperature annealing acts to densify the dielectric material in the trenches (e.g., the dielectric has a WERR of about 1.2:1 to about 1:1). Following the higher temperature anneal, the temperature of the substrate may be decreased down to ambient (e.g., room temperature) and the annealed substrate may be used in further fabrication steps for making semiconductor devices.

Figure 6:
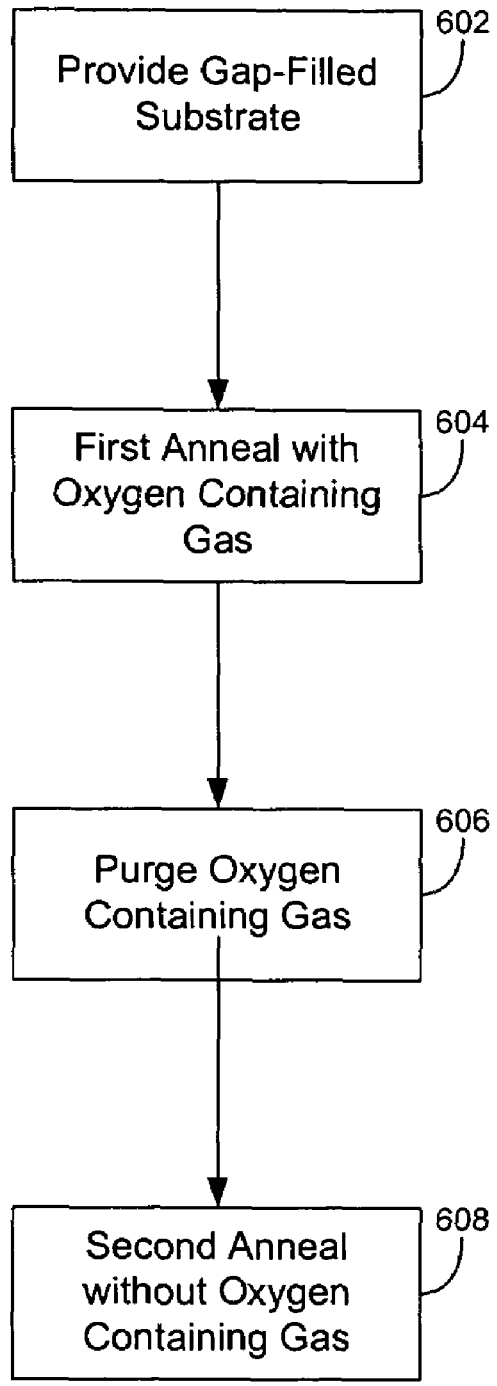
FIG. 6 shows a flowchart illustrating an example of an annealing method according to embodiments of the present invention.

FIG. 6 is a flowchart illustrating methods of annealing according to embodiments of the invention. The illustrated method 600 includes providing a substrate 602 that has one or more trenches that are filled with dielectric material (e.g. silicon dioxide ($SiO_2$), etc.). The dielectric material may be formed in the trenches with a variety of deposition techniques such as chemical vapor deposition (CVD) or spin-on dielectric processes. For example, a mixture of tetraethoxysilane (TEOS) and ozone ($O_3$) may be used to deposit silicon dioxide in the gaps using thermal CVD. In other examples, dielectric materials may be deposited in the gaps using plasma enhanced CVD, and high-density plasma CVD, among other deposition techniques.

The gap filled substrate may then undergo a first anneal 604 that includes heating the substrate to a temperature of, for example, about 400° C. to about 800° C. in the presence of an oxygen containing gas (or gas mixture) for a time of about 15 to 45 minutes (e.g., about 30 minutes). In one example, the oxygen containing gas is in-situ generated steam (ISSG) that is generated by the reaction of hydrogen ($H_2$) and oxygen ($O_2$) gas in a oxy-hydrogen (i.e., $H_2$—$O_2$) torch inside a substrate annealing chamber. Other examples of oxygen containing gas include oxygen ($O_2$), pre-generated steam ($H_2O$), nitric oxide (NO), and nitrous oxide ($N_2O$), among other gases. The oxygen containing gas may also include mixtures of different oxygen containing gases.

Other non-oxygen containing gases may be present with the oxygen containing gas (or gases). For example, hydrogen ($H_2$), nitrogen ($N_2$), and/or an inert gas such as helium (He) or argon (Ar) may be present with the oxygen containing gas. These gases may act as carrier gases that flow together with oxygen containing gas into the annealing chamber and over the substrate.

The anneal in the presence of the oxygen containing gas helps to heal seams in the gaps. For example, a weak seam may be present at the junction of the dielectric material and a sidewall of the trenches. The oxygen containing gas helps strengthen this seam even at anneal temperatures of 800° C. or lower. In addition, the anneal in the presence of the oxygen containing gas reduces the size and can even eliminate voids formed in the dielectric material.

Increasing the temperature of the anneal (e.g., greater than 800° C.) helps to drive out moisture and increase the density of the dielectric material. However, as noted above, the higher temperature annealing in the presence of oxygen containing gas causes the oxygen in the gas to react with oxidation prone materials that make up the substrate, such as silicon (Si), which is undesirable. Thus, to avoid substrate oxidation (and the oxidation of other semiconductor device components) a higher temperature anneal is performed in the absence of oxygen containing gases.

In some embodiments the oxygen containing gases may be purged at the conclusion of the first anneal 606 by flowing a non-oxygen contain gas (or mixture of gases) into the anneal chamber and over the substrate. In one example, the flow of the oxygen containing gas (or gases) may be shut off leaving the non-oxygen containing gases (e.g., dry nitrogen) as the only gases flowing over the substrate. The non-oxygen containing gases may flow through the annealing chamber for about 45 minutes to about 75 minutes (e.g., about 60 minutes) to purge the oxygen-containing gas.

The second anneal may be performed 608 following the purge 606. The second anneal may include ramping up the temperature of the substrate from about 800° C. to about 1100° C. (e.g., about 1050° C.) for about 15 minutes to about 45 minutes (e.g., about 30 minutes) in the presence of one or more non-oxygen containing gases. This second anneal is believed to increase the density of the dielectric material in the gaps to a density comparable to thermally grown dielectrics. However, this higher temperature anneal was performed in the absence of oxygen-containing gases (e.g., steam) that, at those temperatures, may oxidize materials (e.g., Si) in the gap walls and other areas of the substrate.

EXAMPLES

Figure 7:
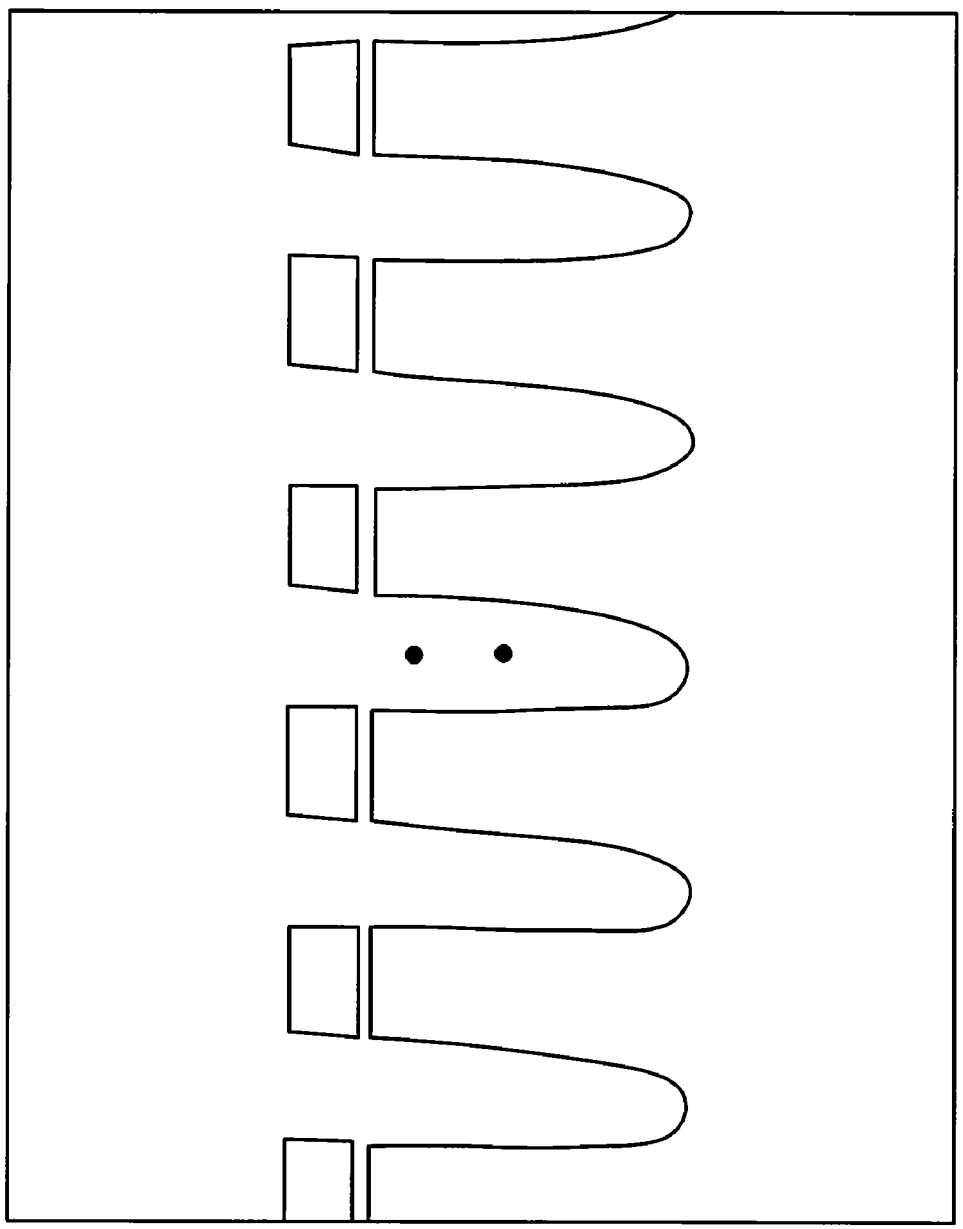
FIG. 7 shows an electron micrograph of comparative gap-filled shallow trench isolation structures that have been conventionally annealed.

Referring now to FIG. 7 a scanning electron micrograph image of dielectric filled trenches in a substrate that has undergone a conventional high-temperature annealing process is shown. The dielectric deposition was done using $O_3$/TEOS HARP process at a temperature of 540° C. and pressure of 600 torr. The filled substrate was annealed in a dry nitrogen atmosphere at 1050° C. for 30 minutes. A void in the dielectric material is seen in first trench from the left and two more voids are clearly seen in the dielectric material in the middle trench (third from the left).

Figure 8:
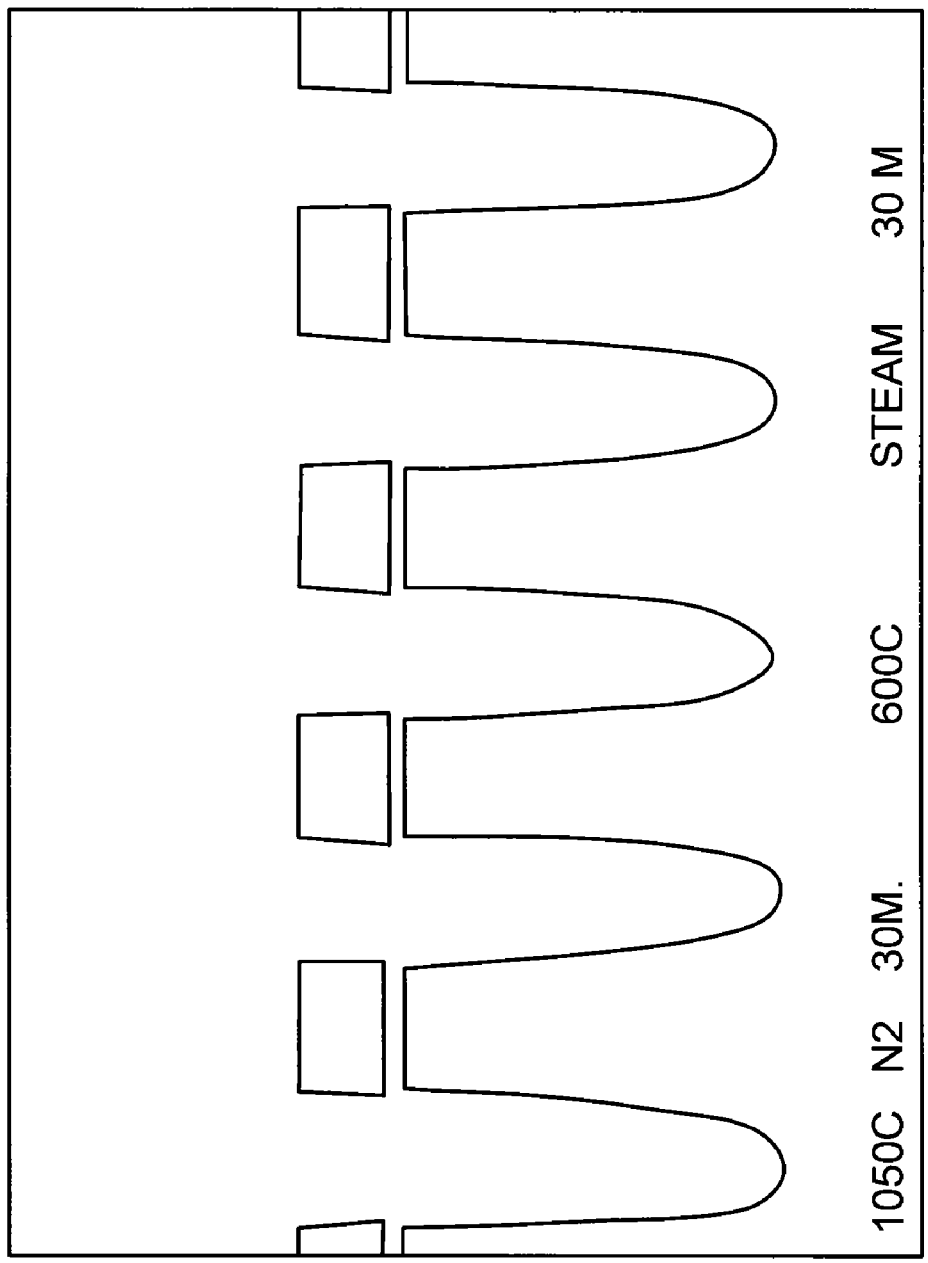
FIG. 8 shows an electron micrograph of gap-filled shallow trench isolation structures that have been annealed according to an embodiment of the method of the present invention.

FIG. 8 shows a scanning electron micrograph image of dielectric filled trenches in a substrate that has undergone an anneal process according to an embodiment of the present invention. The dielectric deposition conditions were the same as described in FIG. 7 above. The anneal process included annealing the trench filled substrate at 600° C. in an atmosphere containing steam ($H_2O$) for 30 minutes, followed by a 1 hour nitrogen ($N_2$) purge of the annealing gases. After the purge, the substrate is annealed in dry nitrogen at 1050° C. for 30 minutes. In contrast to the comparative example above, no weak seams or voids are discernable in the image of FIG. 8.

Having described several embodiments, it will be recognized by those of skill in the art that various modifications, alternative constructions, and equivalents may be used without departing from the spirit of the invention. Additionally, a number of well known processes and elements have not been described in order to avoid unnecessarily obscuring the present invention. Accordingly, the above description should not be taken as limiting the scope of the invention.

Also, the words "comprise," "comprising," "include," "including," and "includes" when used in this specification and in the following claims are intended to specify the presence of stated features, integers, components, or steps, but they do not preclude the presence or addition of one or more other features, integers, components, steps, or groups.

What is claimed is:

1. A method of annealing a substrate comprising a trench containing a dielectric material, the method comprising:

forming the dielectric material on the substrate with chemical vapor deposition by reacting a silicon-containing process gas and an oxidizer-containing process gas, wherein a seam remains within the trench following the operation of forming the dielectric material;

annealing the substrate at a first temperature of about 200° C. to about 800° C. in a first atmosphere comprising an oxygen containing gas to heal the seam; and annealing the substrate at a second temperature of about 800° C. to about 1400° C. in an inert, noble, or ammonia gas atmosphere lacking oxygen.

2. The method of claim 1, wherein the oxygen containing gas comprises steam ($H_2O$), nitric oxide (NO), or nitrous oxide ($N_2O$).

3. The method of claim 1, wherein the oxygen containing gas comprises in-situ generated steam (ISSG) produced from a combustion reaction of hydrogen (H2) and oxygen (O2) gas.

4. The method of claim 1, wherein the first atmosphere comprises nitrogen (N2), hydrogen (H2), ammonia (NH3), helium (He), neon (Ne), Argon (Ar), krypton (Kr), or xenon (Xe).

5. The method of claim 1, wherein the inert, noble, or ammonia gas atmosphere comprises nitrogen (N2), ammonia (NH3), helium (He), neon (Ne), Argon (Ar), krypton (Kr), or xenon (Xe).

6. The method of claim 1, wherein the substrate is kept at the first temperature for about 30 minutes.

7. The method of claim 1, wherein the substrate is kept at the second temperature for about 30 minutes.

8. The method of claim 1, wherein the first temperature is about 600° C. to about 700° C.

9. The method of claim 1, wherein the second temperature is about 1000° C. to about 1100° C.

10. The method of claim 1, the method comprising:

purging the oxygen containing gas away from the substrate with a purge gas; and raising the substrate from the first temperature to the second temperature at a rate of about 4° C./min or more.

11. The method of claim 10, wherein the purge gas comprises the inert gas.

12. The method of claim 10, wherein the oxygen containing gas is purged for about 60 minutes prior to the raising of the substrate to the second temperature.

13. The method of claim 1, wherein the substrate is raised to the first temperature and the second temperature using a furnace or radiative heating chamber.

14. The method of claim 1, wherein, prior to the annealing, a wet etch rate ratio of the dielectric material to thermal oxide is about 10:1 or more.

15. The method of claim 1, wherein, after the annealing at the second temperature, a wet etch rate ratio of the dielectric material to thermal oxide is about 1.2:1 or less.

16. The method of claim 1, wherein the dielectric material comprises silicon dioxide.

17. The method of claim 1, wherein the dielectric material in the trench is deposited using a chemical vapor deposition or a spin-on-dielectric technique.

18. A method of annealing a substrate comprising a trench containing a dielectric material, the method comprising:

depositing the dielectric material in the trench using chemical vapor depositions, wherein a seam remains within the trench following the operation of forming the dielectric material;

annealing the substrate at a first temperature of about 400° C. to about 800° C. in the presence of an oxygen containing gas to heal the seam;

purging the oxygen containing gas away from the substrate; and raising the substrate to a second temperature from about 900° C. to about 1100° C. to further anneal the substrate in an inert, noble, or ammonia gas atmosphere that lacks oxygen.

19. The method of claim 18, wherein the oxygen containing gas comprises in-situ generated steam (ISSG) produced from a combustion reaction of hydrogen ($H_2$) and oxygen ($O_2$) gas.

20. The method of claim 18, wherein the inert gas atmosphere comprises nitrogen ($N_2$).

21. The method of claim 18, wherein the first temperature is about 800° C. and the second temperature is about 1050° C.

22. The method of claim 18, wherein the substrate is maintained at the first temperature for about 30 minutes, the oxygen containing gas is purged away from the substrate for about 60 minutes, and the substrate is maintained at the second temperature for about 30 minutes.

23. The method of claim 1, wherein the silicon-containing process gas comprises TEOS.

24. The method of claim 1, wherein the oxidizer-containing process gas comprises ozone.

25. The method of claim 1, wherein the chemical vapor deposition comprise sub-atmospheric chemical vapor deposition.

26. A method of forming and annealing a dielectric material in a substrate trench, the method comprising:

forming the dielectric material on the substrate with chemical vapor reacting tetraethoxysilane with ozone, wherein a seam remains within the trench following the operation of forming the dielectric material;

annealing the substrate at a first temperature of about 200° C. to about 800° C. in a first atmosphere comprising an oxygen containing gas to heal the seam; and annealing the substrate at a second temperature of about 800° C. to about 1400° C. in an inert, noble, or ammonia gas atmosphere lacking oxygen.

* * * * *